US011507371B2

(12) United States Patent
Kara et al.

(10) Patent No.: US 11,507,371 B2
(45) Date of Patent: Nov. 22, 2022

(54) COLUMN DATA DRIVEN ARITHMETIC EXPRESSION EVALUATION

(71) Applicant: Microsoft Technology Licensing, LLC, Redmond, WA (US)

(72) Inventors: Kaan Kara, Zurich (CH); Kenneth H. Eguro, Seattle, WA (US); Haohai Yu, Redmond, WA (US); Chirag Varde, Seattle, WA (US); Blake D. Pelton, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 418 days.

(21) Appl. No.: 16/710,969

(22) Filed: Dec. 11, 2019

(65) Prior Publication Data

US 2021/0182064 A1 Jun. 17, 2021

(51) Int. Cl.
*G06F 9/30* (2018.01)
*G06F 16/22* (2019.01)
(Continued)

(52) U.S. Cl.
CPC ...... *G06F 9/30043* (2013.01); *G06F 9/30007* (2013.01); *G06F 9/544* (2013.01); *G06F 16/221* (2019.01); *G06F 30/331* (2020.01)

(58) Field of Classification Search
CPC .... G06F 16/283; G06F 16/284; G06F 16/221; G06F 16/245; G06F 9/30043; G06F 30/331; G06F 9/30007; G06F 9/544
See application file for complete search history.

(56) References Cited

U.S. PATENT DOCUMENTS

2010/0005077 A1  1/2010 Krishnamurthy et al.
2011/0270857 A1* 11/2011 Bommireddipalli .........
                                                G06F 16/24564
                                                       707/E17.014
(Continued)

OTHER PUBLICATIONS

Per-Ake Larson et al.; SQL Server Column Store Indexes; ACM; pp. 1177-1184; retrieved on Jul. 26, 2022 (Year: 2011).*

(Continued)

*Primary Examiner* — S. Sough
*Assistant Examiner* — Cuong V Luu
(74) *Attorney, Agent, or Firm* — Fiala & Weaver P.L.L.C.

(57) ABSTRACT

Methods, systems, apparatuses, and computer program products are provided for generating an instruction set for an evaluation engine. An arithmetic expression that combines multiple columns of data (e.g., a first column of data, a second column of data, etc.) is received. Instructions may be generated, that, when executed by an integrated-circuit-based processor, cause the integrated-circuit-based processor to evaluate the arithmetic expression. In examples, a set of instructions may be generated for each column of data represented in the arithmetic expression. For instance, the instructions may comprise a first set of instructions associated with the first column of data, a second set of instructions associated with the second column of data, and so on. The instructions may specify one or more parameters for operations associated with each column of data, such as operations to load data from a buffer, store data into a buffer, arithmetic operations to perform on data, etc.

20 Claims, 6 Drawing Sheets

(51) Int. Cl.
    *G06F 30/331*   (2020.01)
    *G06F 9/54*    (2006.01)

(56) References Cited

U.S. PATENT DOCUMENTS

2013/0346428 A1*  12/2013  Viehland ............... G06F 16/245
                                                       707/756
2017/0031975 A1    2/2017  Mishra et al.
2020/0265052 A1*   8/2020  Fujikawa ............ G06F 16/2282

OTHER PUBLICATIONS

Aravind Yalamanchi et al.; Managing Expressions as Data in Relational Database Systems; CIDR; 11 pages; retrieved on Jul. 26, 2022 (Year: 2003).*

Mishra, et al., "Accelerating Analytics with Dynamic In-Memory Expressions", In Proceedings of the VLDB Endowment, vol. 9, Issue 13, Sep. 1, 2016, pp. 1437-1448.

"International Search Report and Written Opinion Issued in PCT Application No. PCT/US20/059249", dated Feb. 24, 2021, 14 Pages.

* cited by examiner

500

Generating a decompressed column of data and loading the decompressed column of data into a local buffer.

Generate an instruction to cause the IC-based processor to output a combined column of data to a destination memory

Divide an arithmetic expression into a plurality of sub-batches for execution, the instructions for each sub-batch being executed in parallel

COLUMN DATA DRIVEN ARITHMETIC EXPRESSION EVALUATION

BACKGROUND

Executing database queries has typically relied upon processing resources of a computing system's central processing unit (CPU). While CPUs can carry out such operations, it has become increasingly common to offload a portion of the execution to other processing devices, such as a special purpose integrated circuit (IC) that may be part of the same computing system. When offloading the portion of the execution in this manner, the data upon which operations are to be carried out is typically transferred from a memory of the computing system for processing by an execution engine of the special purpose IC.

In many instances, the execution engine of the special purpose IC is computation driven. For instance, where processing operations are sought to be performed on two or more columns of data, the execution engine may need to obtain all of the columns of data and store the data to an intermediate buffer prior to performing one or more operations that effectively converts the column-store to a local row-store. However, such an approach requires a large buffer size in the special purpose IC, which typically have limited memory capacities. Even where sufficient buffer sizes are present on a special purpose IC, many computations refer to the same set of input data (e.g., column data values) multiple times. Because execution engines of special purpose ICs are computation driven, the same set of input data may be retrieved multiple times, leading to inefficiencies in performing operations. Furthermore, where the input data is received in a compressed format, the execution engine may need to decompress the same set of data multiple times, further consuming processing resources and leading to inefficient execution.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods, systems, apparatuses, and computer program products are provided for generating an instruction set for an evaluation engine. An arithmetic expression that combines a plurality of columns of data is received, for instance, at a database application. An instruction compiler may generate instructions, that when executed an integrated-circuit-based processor, evaluates the arithmetic expression. The instruction compiler may generate instructions in a column-data driven manner (e.g., by generating a set of instructions associated with each column of data represented in the arithmetic expression). For instance, the instruction compiler may generate a first set of instructions, that when carried out by the integrated-circuit-based processor, causes the integrated-circuit-based processor to obtain a first column of data, perform any number of operations on the first column of data (including no arithmetic operations), and store the results in a buffer local to the integrated-circuit-based processor. The instruction compiler may also generate a separate set of instructions, that when carried out by the integrated-circuit-based processor, causes the integrated-circuit-based processor to obtain a second column of data, perform any number of operations on the second column of data (e.g., an operation that combines the second column of data with the first column of data obtained from the local buffer), and output the result.

Furthermore, as described in greater detail below, the integrated-circuit-based processor may also be configured to evaluate the arithmetic expression in sub-batches. For instance, where two columns of data are represented in the arithmetic expression, the integrated-circuit-based processor may execute a first set of instruction associated with a first column of data when a sub-batch of the first column of data is received, and then execute the second set of instructions associated with the second column of data when a sub-batch of the second column of data is received. Such instructions may be repeated until all of the values of the columns of data are evaluated (i.e., the instructions are executed for all of the sub-batches). As will be described in greater detail below, examples are not limited to combining only two columns of data, but may be implemented to combine any number of columns of data.

Further features and advantages, as well as the structure and operation of various embodiments, are described in detail below with reference to the accompanying drawings. It is noted that the disclosure is not limited to the specific embodiments described herein. Such example embodiments are presented herein for illustrative purposes only. Additional example embodiments will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate example embodiments of the present application and, together with the description, further serve to explain the principles of the example embodiments and to enable a person skilled in the pertinent art to make and use the example embodiments.

FIG. 5 shows a flowchart of a method for generating instructions to evaluate an arithmetic expression, according to an example embodiment.

FIG. 6 shows a flowchart of a method for generating an instruction to output a combined column of data to a memory of an integrated-circuit-based processor, according to an example embodiment.

FIG. 7 shows a flowchart of a method for dividing an arithmetic expression into a plurality of sub-batches, according to an example embodiment.

Figure 1:
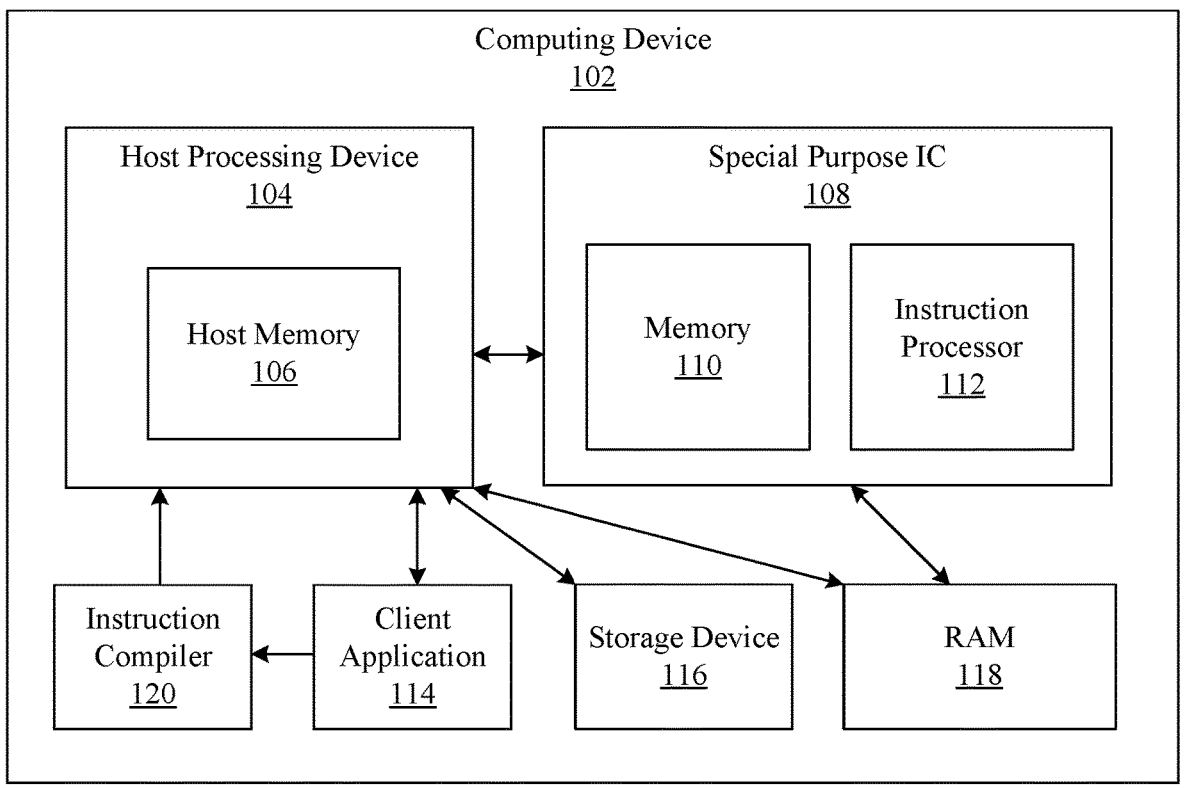
FIG. 1 shows a block diagram of a system for executing an arithmetic expression in a special purpose IC, according to an example embodiment.

The features and advantages will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present specification and accompanying drawings disclose one or more embodiments that incorporate the features described herein. The scope of the disclosure is not limited to the disclosed embodiments. The disclosed embodiments merely illustrate features described herein, and modified versions of the disclosed embodiments are also encompassed by the disclosure. Example embodiments of the disclosure are defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an example embodiment, it is submitted that it is within the knowledge of one skilled in the art to effect such feature, structure, or characteristic in connection with other embodiments whether or not explicitly described.

In the discussion, unless otherwise stated, adjectives such as "substantially" and "about" modifying a condition or relationship characteristic of a feature or features of an example embodiment of the disclosure, are understood to mean that the condition or characteristic is defined to within tolerances that are acceptable for operation of the embodiment for an application for which it is intended.

Numerous exemplary embodiments are described as follows. It is noted that any section/subsection headings provided herein are not intended to be limiting. Embodiments are described throughout this document, and any type of embodiment may be included under any section/subsection. Furthermore, embodiments disclosed in any section/subsection may be combined with any other embodiments described in the same section/subsection and/or a different section/subsection in any manner.

II. Example Implementations

Executing database queries has typically relied upon processing resources of a computing system's central processing unit (CPU). While CPUs can carry out such operations, it has become increasingly common to offload a portion of the execution to other processing devices, such as a special purpose integrated circuit (IC) that may be part of the same computing system. When offloading the portion of the execution in this manner, the data upon which operations are to be carried out is typically transferred from a memory of the computing system for processing by an execution engine of the special purpose IC.

In many instances, the execution engine of the special purpose IC is computation driven. For instance, where processing operations are sought to be performed on two or more columns of data, a naïve or typical approach may require obtaining, decompressing, and storing all of the columns of data on an in-chip memory of the special purpose IC prior to performing one or more operations that effectively converts the column-store to a local row-store. In other words, an entire row of data may need to be decompressed and stored on such a temporary memory. However, this approach requires a large buffer size in the special purpose IC, which typically has limited memory capacities. Even where sufficient buffer sizes are present on a special purpose IC, many computations refer to the same set of input data (e.g., column data values) multiple times. Because execution engines of special purpose ICs are computation driven, the same set of input data may be retrieved multiple times, leading to inefficiencies in performing operations.

Furthermore, many systems store column data in a compressed format, which may require decompression prior to evaluating an arithmetic expression. Where the input data is received in a compressed format, the execution engine may need to decompress the same set of data multiple times, further consuming processing resources and leading to inefficient execution. In other words, the decompression computation itself can require significant computing resources. While the computation requirements can potentially be relieved by storing the decompressed values in a memory of the special purpose IC as described in a naïve approach above (which is often difficult, as the memory space is limited), the increased buffer sizes reserved for such computations reduces the amount of batches that the special purpose IC can process in parallel, which can negatively impact overall performance.

Embodiments described herein address these and other issues by providing techniques for generating instructions for evaluating an arithmetic expression in an intelligent manner. In an example system, an instruction compiler may receive an arithmetic expression, e.g., from a database application, that combines multiple columns of data. The instruction compiler may generate a set of instructions for each column of data, such that the instructions, when executed by an integrated-circuit-based processor, may evaluate the arithmetic expression. As described in greater detail below, the instructions may be generated in a manner that allows the arithmetic expression to be evaluated without storing (e.g., in a temporary buffer of a special purpose IC) all of the input data at once. In other words, the computations may be structured such that, when the instructions are executed, an instruction processor may selectively perform operations on incoming data, and store intermediate results in a local buffer, and re-use the buffer for subsequent operations (on the same set of data or on different sets of data, such as a different column of data). As a result, the simultaneous storage of all of the input data for a given arithmetic expression may be reduced, or even avoided in some instances, and instead the instructions may be generated in a manner that requires storing only the data in the local buffer that may be needed for subsequent operations.

In an illustrative example, such as where two columns of data are to be combined, the generated instructions may include a first set of instructions that causes the integrated-circuit-based processor to receive the first column of data and load the first column of data or values derived therefrom into a local buffer. The instructions may also include a second set of instructions that comprises a plurality of instructions. One or more instructions of the second set of instructions, for instance, may cause the integrated-circuit-based processor to receive the second column of data and combine the second column of data or values derived therefrom with the values retrieved from the local buffer (which, at this particular point in time may temporarily store the first column of data or values derived therefrom) to produce an intermediate column of data. Since the first column of data (or values derived therefrom) may not be needed for any subsequent operations, one or more instructions of the second set of instructions may cause the intermediate column of data to be stored in the same buffer (i.e., the buffer may be re-used). The second set of instructions may also comprise one or more additional instructions, such as to combine the second column of data or values derived therefrom with the intermediate column of data that is retrieved from the local buffer to produce a combined column of data. While techniques are illustrated using an example that combines two columns of data, it is noted and understood that any number of columns of data may be combined in accordance with example embodiments described herein. In other words, an arithmetic expression may compiled to generate a set or group of instructions for each column of data in the arithmetic expression, and evaluation of the arithmetic expression may be carried out in accordance with the generated instructions.

Embodiments are also described herein that provide a system architecture for execution of instructions. For instance, an integrated-circuit-based processor may comprise evaluation engine for evaluation an arithmetic expression in accordance with instructions generated by the instruction compiler. In an example system, the integrated-circuit evaluation engine may include an instruction receiver that receives instructions containing various parameters that specify how the evaluation engine should evaluate the arithmetic expression. Such parameters may include, but are not limited to, a first load parameter, a second load parameter, a first constant value parameter, a second constant value parameter, a first operation parameter, and a second operation parameter. Each such parameter identified in the instructions may control the how various inputs, operations and/or outputs are handled by the evaluation engine.

In the above manner, column data relied upon by the integrated-circuit-based processor may be retrieved only once, resulting in a performance improvement when evaluating an arithmetic expression. For instance, since column data is often stored in a host system in a compressed format, the generated instructions may cause the integrated-circuit evaluation engine, when executing the instructions generated by the compiler, to obtain and decompress each column of data and selectively perform one or more operations on the decompressed data and/or other data (e.g., data that may be stored in a local buffer of the integrated-circuit-based processor, a constant value, etc.) and output the result to the local buffer or to another destination. As a result, since instructions may be generated in a column-driven manner (e.g., as opposed to an operation driven manner), duplicative decompression may be avoided, which may allow the integrated-circuit-based processor to better utilize its limited resources. Furthermore, the instruction compiler may also be configured to generate instructions in a manner that may avoid or minimize storage of decompressed column values in a local buffer. For instance, the instructions may perform operations on decompressed values (e.g., obtained from an input register or the like) and store the results of such an operation in a local buffer. Such an approach may reduce the buffer allocation needed for evaluating arithmetic expressions in an integrated-circuit-based processor, which may in turn allow for an increase in the number of batches that the integrated-circuit-based processor may execute in parallel. As a result, not only are resources preserved through the generation of instructions and execution of those instructions in an evaluation engine as described, improvements in performance may also be achieved when evaluating arithmetic expressions in accordance with implementations.

Example embodiments are described as follows for systems and methods for evaluating an arithmetic expression using a column data driven approach. For instance, FIG. 1 shows a block diagram of a system 100 for executing an arithmetic expression in a special purpose IC, according to an example embodiment. As shown in FIG. 1, system 100 includes a computing device 102. Computing device 102 includes a host processing device 104, a special purpose IC 108, a client application 114, a storage device 116, a random-access memory (RAM) 118, and an instruction compiler 120. As shown in FIG. 1, host processing device 104 includes a host memory 106. Special purpose IC 108 includes a memory 110 and an instruction processor 112. It is understood that system 100 may comprise any other components and/or subcomponents, and may be coupled to any other devices not expressly illustrated in FIG. 1. System 100 is further described as follows.

Computing device 102 may comprise any device or collection of devices (e.g., a distributed network of devices) for receiving and/or processing requests. For instance, computing device 102 may comprise a server or number of servers, such as a network-accessible server (e.g., a cloud computing server network) that are each accessible by a network such as the Internet (e.g., in a "cloud-based" embodiment) to store, manage, and process data. Computing device may comprise any number of computing devices, and may include any type and number of other resources, including resources that facilitate communications with and between the servers, storage by the servers, etc. (e.g., network switches, storage devices, networks, etc.). In an embodiment, computing device 102 may be co-located with other devices (e.g., housed in one or more nearby buildings with associated components such as backup power supplies, redundant data communications, environmental controls, etc.) to form a datacenter, or may be arranged in other manners. Accordingly, in an embodiment, computing device 102 may be a datacenter in a distributed collection of datacenters.

In some other examples, computing device 102 may include a computing device of one or more users (e.g., individual users, family users, enterprise users, governmental users, etc.) that may comprise one or more applications, operating systems, virtual machines, storage devices, etc. that may be used to store, retrieve, and/or analyze data (e.g., database data) that may be stored locally and/or remotely. In some examples, computing device 102 may access one or more server devices to access such data. Computing device 102 may include any number of computing devices, including tens, hundreds, thousands, millions, or even greater numbers of computing devices. Computing device 102 may be any type of stationary or mobile computing device, including a mobile computer or mobile computing device (e.g., a Microsoft® Surface® device, a personal digital assistant (PDA), a laptop computer, a notebook computer, a tablet computer such as an Apple iPad™, a netbook, etc.), a mobile phone, a wearable computing device, or other type of mobile device, or a stationary computing device such as a desktop computer or PC (personal computer), or a server. Computing device 102 is not limited to a physical machine, but may include other types of machines or nodes, such as a virtual machine. Computing device 102 may interface with other devices (e.g., server devices) through one or more application programming interfaces (APIs) and/or by other mechanisms. Note that any number of program interfaces may be present.

Computing device 102 may be coupled to a network, such as any one or more of any of a local area network (LAN), a wide area network (WAN), a personal area network (PAN), a combination of communication networks, such as the Internet, and/or a virtual network. Computing device 102 may each include at least one network interface that enables communications with other devices not expressly shown in FIG. 1. Examples of such a network interface, wired or wireless, include an IEEE 802.11 wireless LAN (WLAN) wireless interface, a Worldwide Interoperability for Microwave Access (Wi-MAX) interface, an Ethernet interface, a Universal Serial Bus (USB) interface, a cellular network interface, a Bluetooth™ interface, a near field communication (NFC) interface, etc.

In examples, computing device 102 may include one or more devices for processing Structured Query Language (SQL) queries generated via client application 114. In some implementations, client application 114 may comprise a database application that may be used to store, retrieve, and/or analyze database information that may include sensitive information through one or more database queries. In accordance with techniques described herein, client application 114 may comprise a database application which stores data in a columnar format. In other words, client application 114 may comprise a columnar store of database data that stores information in a column-oriented format. In some example implementations, client application 114 may store such information using one or more column-oriented compression formats, such as Run Length Encode (RLE), bit-packing, hash dictionary compression, or other compression techniques known and appreciated to those skilled in the relevant arts. It is noted that these examples are not intended to be limiting, and client application 114 may include any other application that may enable a user to access and/or analyze data.

Client application 114 may be installed locally on computing device 102 or may be located on a separate computing device or node (e.g., virtual machine or the like) that is remote from computing device 102. For instance, client application 114 may comprise an end-user application, which may comprise one or more locally installed software packages, software as a service (SaaS) packages, and/or platform as a service PaaS) packages, web applications, etc. that may be used to access sensitive information. For instance, client application 114 may include software relating to data analytics, databases, business intelligence, or any other software for accessing, modifying, and/or deleting content stored in any local or remote storage device as described herein.

Data relied upon client application 114 (such as column-oriented data in some examples) may be stored in storage device 116. Storage device 116 may include any other type of data that may be stored in any structure (e.g., in a structured database, in an unstructured form, as electronic files, tables, etc.) in any one or more file systems. Storage 116 may comprise one or more local or on-premise storage devices, such as physical storage devices (e.g., hard disk drives, flash drives, solid-state drives, optical disk drives, RAM devices, etc.) and/or one or more cloud-based storages. In some examples, storage device 116 may store information in a secure manner, such as via password protection, encryption (e.g., public and private key encryption, symmetric keys, etc.), or any other secure manner as appreciated by those skilled in the relevant arts.

Host processing device 104 may comprise a processor of computing device 102 for processing requests on a host machine (e.g., computing device 102), such as requests received from client application 114 and/or instruction compiler 120. Host processing device 104 may comprise any type of processor, such as a CPU, a graphics processing unit (GPU), etc. In implementations, host processing device 104 may include any number of processors, including multiple separate processing devices, multi-core processors, etc. Host processing device 104 may also include host memory 106, which may comprise a hardware cache local to host processing device 104. For instance, host memory 106 may be configured to temporarily store data obtained from other sources (e.g., other volatile or non-volatile memory devices) for processing by host processing device 104. An example of host memory 106 includes, but it is not limited to, static RAM (SRAM) that is located on a same chip as host processing device 104. In some other implementations, host memory 106 may also comprise a virtual memory (e.g., by transferring data storage device 116 of the host computing device).

In some other examples, host processing device 104 may also be communicatively coupled to RAM 118, such as a dynamic RAM (DRAM), synchronous DRAM (SDRAM), or any other memory RAM that may be co-located on the same host machine. Host processing device 104 and RAM 118 may be communicatively coupled in any suitable manner, such as a front-side bus (FSB) or system bus with any appropriate bus width (e.g., 8 bits, 16 bits, 32 bits, etc.).

In accordance with examples described herein, host processing device 104 may be configured to offload one or more operations for execution by special purpose IC 108, instead of by host processing 104. For instance, host processing device 104 may offload operations that may be more efficiently processed by special purpose IC 108, which may lead to an overall performance enhancement when processing requests (e.g., database queries). In some implementations, instruction compiler 120 may generate instructions for one or more operations associated with an arithmetic expression for evaluation generated at client application 114 for execution by special purpose IC 108.

Special purpose IC 108 may comprise any type of integrated circuit programmed and/or designed to carry out certain types of tasks or operations. For instance, special purpose IC 108 may be a Field-Programmable Gate Array (FPGA) device, an Application Specific Integrated Circuit (ASIC), or other similar device that may comprise one or more processors to execute operations (e.g., instructions, computations, etc.) that is separate from host processing device 104. In other words, special purpose IC 108 may comprise appropriate circuitry to perform processing tasks for a host process that may be executing on an external processing unit, such as host processing device 104. In some examples, special purpose IC 108 may comprise a separate physical board or component that may be installed and/or housed within computing device 102. In other examples, special purpose IC 108 may be located external to computing device 102 and be communicatively coupled to computing device 102, such as via USB, serial port, IEEE 1394, a network interface, or any other interface.

As shown in FIG. 1, special purpose IC 108 may comprise memory 110 and instruction processor 112. Memory 110 may comprise a volatile or non-persistent memory co-located with special purpose IC 108 for storing data processed by special purpose IC 108. For instance, memory 110 may comprise, for instance, one or more local buffers that may store, at least temporarily, data for which operations have been performed and/or operations are to be performed. In examples, when special purpose IC 108 performs operations on data, special purpose IC 108 may store intermediate data in memory 110 that may be later accessed for one or more subsequent operations.

As will be described in greater detail below, instruction processor 112 may be configured evaluate arithmetic expressions as instructed by instruction compiler 120. Instruction compiler 120 may obtain an arithmetic expression for evaluation generated at client application 114, such as an arithmetic expression to combine a plurality of columns of database data. Instruction compiler 120 may generate instructions, that when executed by instruction processor 112 of special purpose IC 108, evaluate the arithmetic expression. In accordance with implementations described herein, instruction compiler 120 may generate instructions in a column-data driven manner. In other words, instruction compiler 120 may generate a set of instructions for each column of data represented in the arithmetic expression, such that instruction processor 112 may efficiently evaluate the arithmetic expression in a manner that preserves both in-chip memory resources and processing resources. For instance, instruction compiler 120 may generate sets of instructions, that when executed by instruction processor 112, cause instruction processor 112 to obtain data (such as column-oriented data), selectively perform operations on the data, and store intermediate results in a local buffer that may be reused for subsequent operations on the same set of data or on different sets of data (e.g., a separate column of data). In this manner, instruction processor 112 may be enabled to reduce, or even avoid in some instances, the simultaneous storage of all of the input data that may be relied upon to evaluate a given arithmetic expression, and instead only store the data in the local buffer that may be needed for subsequent operations. Where the data is not needed for subsequent operations, instruction compiler 120 may specify that the same buffer be re-used to store subsequent column (or columns) of intermediate data, thus preserving in-chip memory resources of special purpose IC 108. Such an approach may allow for increased parallelism of operations, such as where special purpose IC 108 comprises a plurality of instruction processors 112 that each operate in parallel to process a sub-batch of data. Such techniques will be described in greater detail below.

Furthermore, since instruction compiler 120 may generate separate instructions for each column of input data, instruction compiler 120 may generate instructions in a manner that does not require input columns of data to be obtained (and sometimes decoded) multiple times. For instance, instruction compiler 120 may generate a set of instructions, that when carried out by instruction processor 112, causes instruction processor 112 to obtain a first column of data, perform an operation on the column of data, and store the results of the operation (e.g., an intermediate result of the arithmetic expression) in a buffer local to instruction processor 112 (e.g., memory 110). Instruction compiler 120 may also generate a separate set of instructions, that when carried out by instruction processor 112, causes instruction processor 112 to obtain a second column of data, perform an operation that combines the second column of data with values loaded from a local buffer (e.g., the first column of data, or values derived therefrom), and output the result to either memory 110 and/or a memory that may be accessed by client application 114. In this manner, each column of data may be obtained only once, which may preserve resources on special purpose IC 108 and improve performance. In addition, as described above, in some further examples, the same local buffer used to store a first intermediate values may also be used to store a subsequent intermediate result, such as where the first intermediate values are no longer needed to evaluate the arithmetic expression, thereby further preserving memory resources.

In implementations, instruction compiler 120 may generate instructions for each column of data in various ways. In accordance with some example embodiments, instruction compiler 120 may generate a program that may comprise a plurality of instructions to be carried out by instruction processor 112 to evaluate an arithmetic expression. The program may identify, for instance, various parameters that identify how instruction processor 112 should operate to evaluate the arithmetic expression, including but not limited to a first load parameter, a second load parameter, a first operation parameter, and a second operation parameter. In some implementations, the first and second load parameters may specify load addresses from which data values are loaded to first and second input stages, respectively. The first operation stage parameter may specify a first operation to be performed on input data values and/or the first load values, while the second operation stage parameter may specify a second operation to be performed on input data values and/or a second load values. In some further examples, a store parameter may also be specified that indicates an address of a local buffer to which outputs from the second operation stage should be stored. In yet further implementations, the program may also comprise first and second constant value parameters which may specify constant values that may be used in the arithmetic operations of the first and second stages, respectively. Furthermore, any number of operational stages may be implemented, with any number of inputs being selected for each operational stage. The examples described herein are illustrative only, and not intended to be limiting.

It is noted and understood that implementations are not limited to the illustrative arrangement shown in FIG. 1. Rather, system 100 comprise any number of computing devices and/or servers coupled in any manner. For instance, though host processing device 104, special purpose IC 108, client application 114, storage device 116, RAM 118, and instruction compiler 120 are shown as being part of computing device 102, any one or more of such components may be located remote from each other, may be implemented on a single computing device or server, or may be implemented on or distributed across one or more additional computing devices not expressly illustrated in FIG. 1.

It is also noted and understood that although example embodiments are described in which instruction processor of special purpose IC 108 may carry out instructions generated by instruction compiler 120, implementations are not so limited. Rather, it is understood that other processing devices, such as a CPU of host processing device 104 (or any other processing device not expressly shown or described), may carry out all, or part of, instructions generated by instruction compiler 120 in some implementations.

Figure 2:
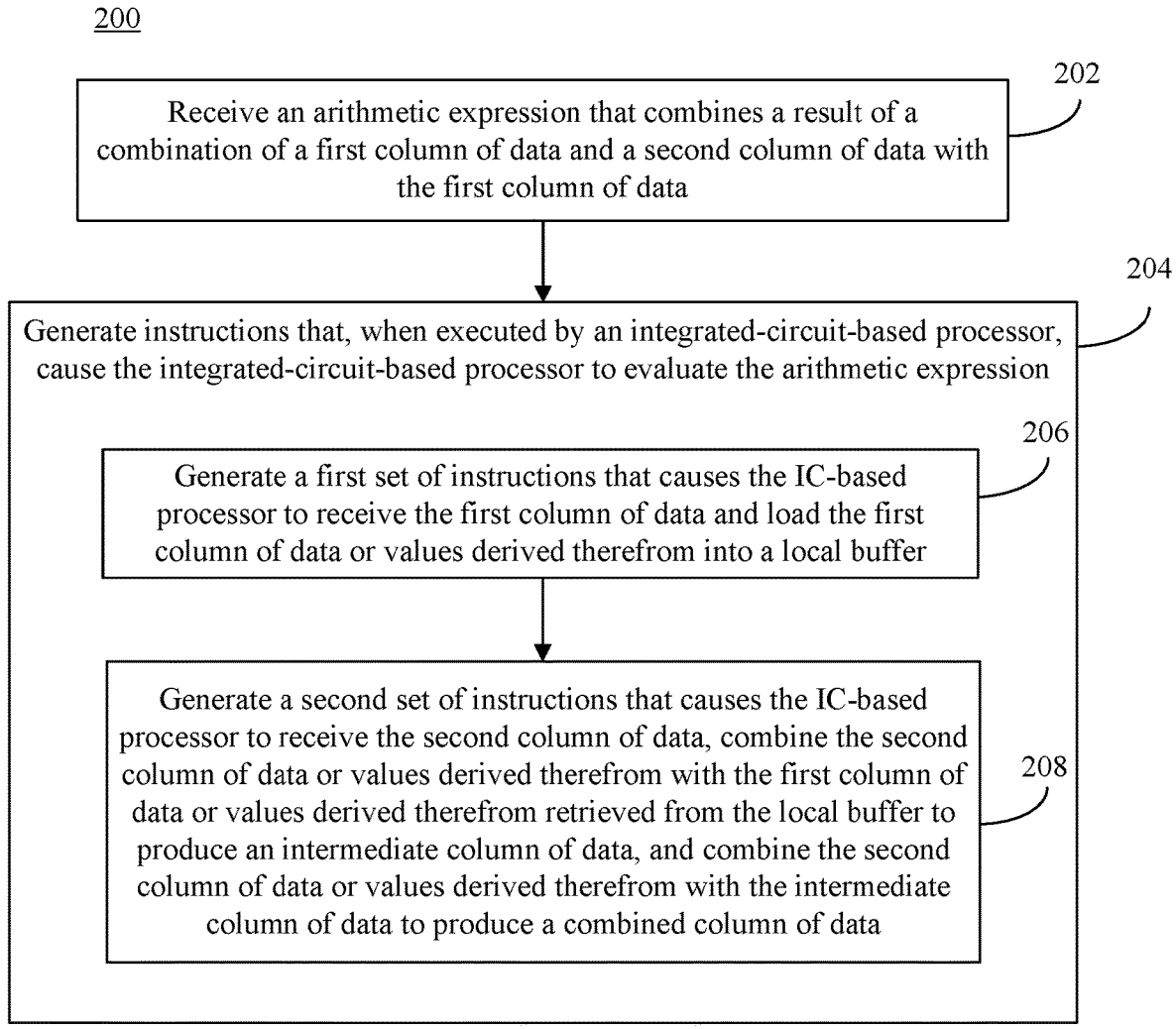
FIG. 2 shows a flowchart of a method for generating instructions to evaluate an arithmetic expression, according to an example embodiment.

Instruction processor 112 and instruction compiler 120 may operate in various ways to evaluate an arithmetic expression. For instance, instruction compiler 120 and/or instruction processor 112 may operate according to FIG. 2. FIG. 2 shows a flowchart 200 of a method for generating instructions to evaluate an arithmetic expression, according to an example embodiment. For illustrative purposes, flowchart 200, instruction compiler 120, and instruction processor 112 are described as follows with respect to FIGS. 3 and 4.

Figure 3:
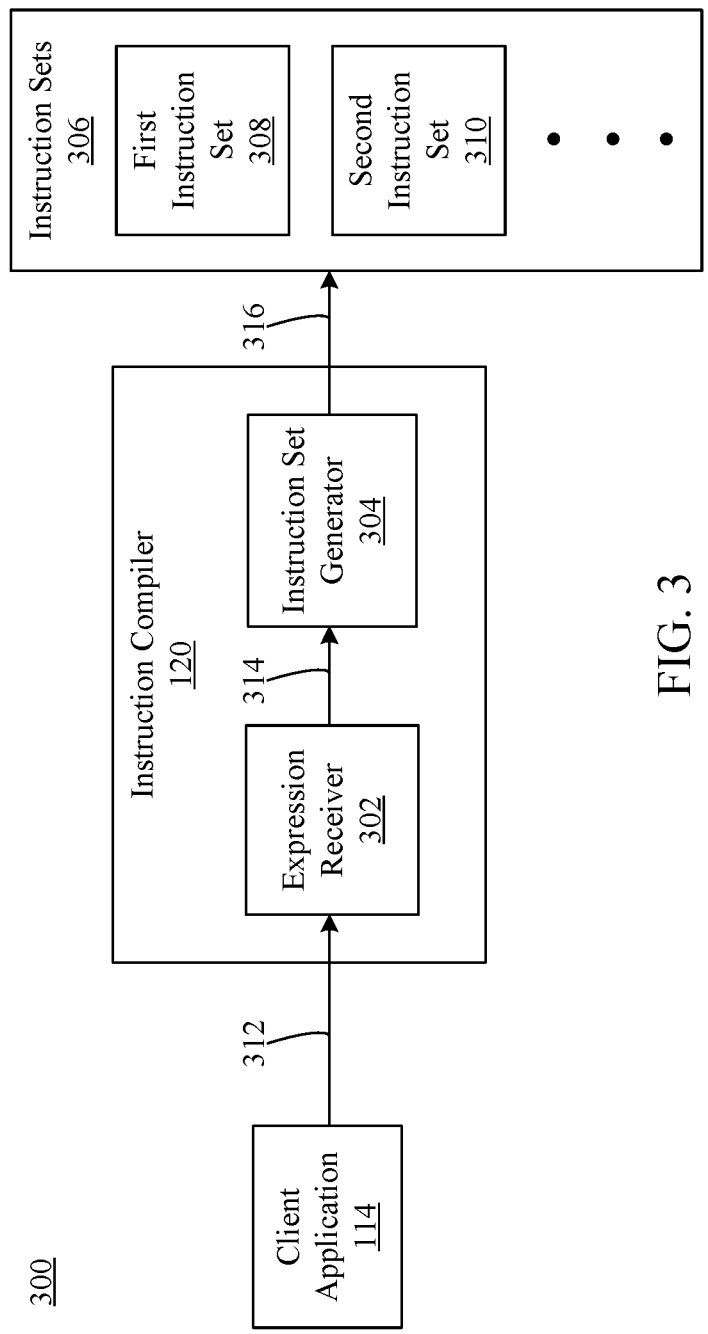
FIG. 3 shows a block diagram of an example compiling system for generating sets of instructions, according to an example embodiment.
Figure 4:
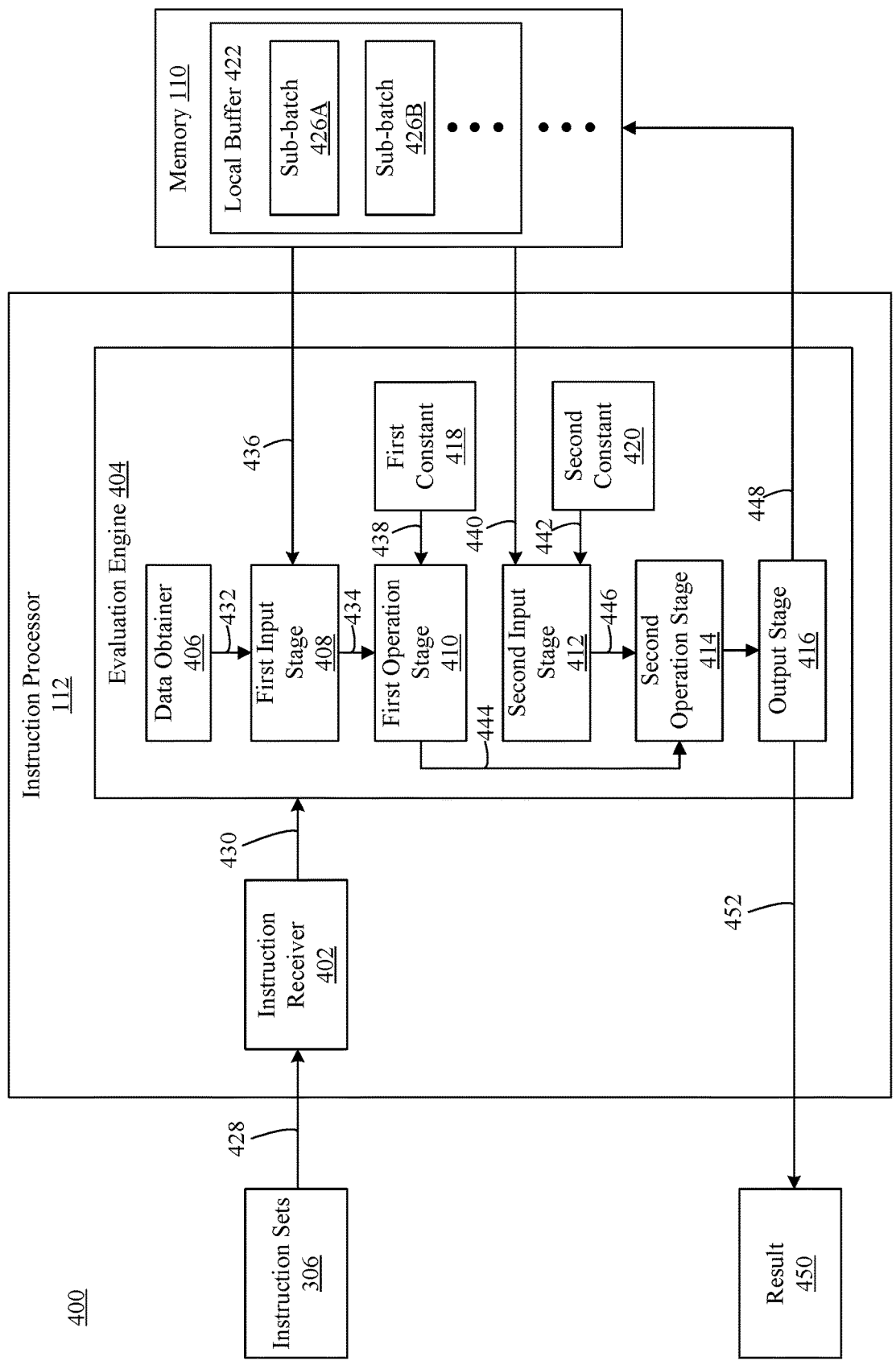
FIG. 4 shows a block diagram of an example instruction processing system for evaluating an arithmetic expression, according to an example embodiment.

FIG. 3 shows a block diagram of an example compiling system 300 for generating sets of instructions, according to an example embodiment. FIG. 4 shows a block diagram of an example instruction processing system 400 for evaluating an arithmetic expression, according to an example embodiment. As shown in FIG. 3, system 300 includes an example implementation of client application 114 and instruction compiler 120. Instruction compiler 120 includes an expression receiver 302 and an instruction set generator 304. Instruction compiler 120 may be configured to generate instruction sets 306, which may include a first instruction set 308, a second instruction set 310, and so on. As shown in FIG. 4, system 400 includes an example implementation of instruction sets 306, memory 110, and instruction processor 112. Memory 110 includes local buffer 422. Local buffer 422 may include a plurality of buffers (not expressly shown), each of which may be configured to comprise one or more buffer spaces for sub-batches, such as sub-batch 426A, 426B, and so on. Instruction processor 112 includes an instruction receiver 402 and an evaluation engine 404, and may be configured to output a result 450 of an arithmetic expression. Evaluation engine 404 includes a data obtainer 406, a first input stage 408, a first operation stage 410, a second input stage 412, a second operation stage 414, and output stage 416, a first constant 418, and a second constant 420. Flowchart 200, system 300, and system 400 are described in further detail as follows.

Flowchart 200 of FIG. 2 begins with step 202. In step 202, an arithmetic expression that combines a result of a combination of a first column of data and a second column of data with the second column of data is received. For instance, with reference to FIG. 3, expression receiver 302 may receive 312 an arithmetic expression from client application 114. In examples, the arithmetic expression received by expression receiver 302 may include an arithmetic expression to combine a plurality of columns of data (e.g., columnar database values). For instance, the arithmetic expression may include an expression to combine a result of a combination of a first column of data and a second column of data with the second column of data. As an illustration, an arithmetic expression generated at client application 114 may comprise a combination of two columns of data, column A and B, in a form such as Column B*Column A+Column A. This example is only one illustration, and it is understood that expression receiver 302 may receive any type of arithmetic expression generated at client application 114, including but not limited to expressions that combines columns and/or rows of data, expressions that combine other forms of data (e.g., data that is not stored in a column-oriented format). Furthermore, the received arithmetic expression may combine any number of values, including but not limited to any number of columns and/or rows of data. Thus, while example embodiments may be described where the arithmetic expression combines two columns of data, it is understood that such illustration is not intended to be limiting in any way, and techniques may be applied to any number of columns of data.

In examples, the arithmetic expression for evaluation may be generated at client application 114 by a user or via any other manner. For instance, a user of a data analytics application (e.g., a business intelligence software package or any other type of software for analyzing data) may interact with client application 114 to identify a desired arithmetic expression to perform on one or more sets of data. In such examples, the user may input a query (e.g., a SQL query) identifying the sets of data and the operation to be performed to obtain a set of results. In other examples, the user may input a desired expression any other suitable manner (e.g., via interaction with a graphical user interface of client application 114 or the like). The arithmetic expression may comprise any type of evaluation and/or analysis of data, including but not limited to addition, subtraction, multiplication, division, or other mathematical operations (or combinations thereof) that may be performed on one or more sets of data. It is noted that client application 114 may be located local to, or on the same device as, computing device 102 or may be located remotely (e.g., client application may be executed on another device or in the cloud).

In some implementations, client application 114 may be configured to execute, on host processing device 104, a SQL process (e.g., a process that may receive queries, such as user-generated SQL queries via client application 114 for execution, and causes such queries to be processed). In some instances, as described herein, one or more operations may be offloaded to special purpose IC 108, such as where certain database operations (e.g., operations on column-oriented data, group aggregations, etc.) for enhanced performance or for any other reason. As will be described in greater detail below, in such instances, instruction compiler 120 may be configured to generate instructions that may be carried out by special purpose IC 108 to evaluate the arithmetic expression, and/or return the results of such expression to client application 114. When an arithmetic expression is generated at client application, it is noted that the underlying data on which operations are to be performed may be shifted or transferred from a memory of the host computing device (e.g., host memory 106 and/or RAM 118) to special purpose IC 108 based on instructions generated by instruction compiler 120.

In step 204, instructions are generated, that when executed by an integrated-circuit-based processor, cause the integrated-circuit-based processor to evaluate the arithmetic expression. For instance, with reference to FIG. 3, instruction set generator 304 may be configured to receive 314 the arithmetic expression and generate 316 instruction set 306, that when executed by instruction processor 112 of special purpose IC 108, cause instruction processor 112 to evaluate the arithmetic expression. Instruction set 306 may collectively comprise a program, or the like, which includes a plurality of instructions or instruction sets. In some examples, instruction set 306 may include first instruction set 308, second instruction set 310, and so on, where each set or group of instructions corresponds to a column of data in the arithmetic expression. It is noted that any number of instructions and/or instruction sets may be included in instruction sets 306. For instance, instruction set 306 may include three sets of instructions if three columns of data are represented in an arithmetic expression, four sets of instructions if four columns of data are represented in an arithmetic expression, and so on. As described in greater detail herein, an instruction set associated with a particular column data may be executed when the data associated with the particular column of data (when may comprise the entire column, or a sub-batch, as described later) is received. In other words, first instruction set 308 may be executed when the data associated with the first column of data (or a sub-batch thereof) is received, second instruction set 310 may be executed when the data associated with the second column (or a sub-batch thereof) is received, and so on.

Instruction sets 306 generated by instruction set generator 304 may provide parameters by which instruction processor 112 may operate to evaluate an arithmetic expression. For example, instruction sets 306 may indicate, for each column of data, which inputs to select (e.g., whether to select an input from a primary input, such as input register, or load the input from a local buffer). In a further implementation, such as where instruction processor 112 may comprise a plurality of arithmetic logic units (ALUs), each ALU representing an operational stage, instruction sets 306 may further identify which inputs to select for each stage of the ALU. In yet a further implementation, instruction sets 306 may also specify the computations, if any, that should be performed at each stage of the ALU. Instruction sets 306 may also specify how the result of the final stage of the ALU should be handled, such as by storing the result in a buffer local to instruction processor 112 (e.g., an intermediate buffer that may be used for subsequent operations) or returning the result to client application 114 (e.g., a final result of the arithmetic expression). In other words, instruction set generator 304 may compile the arithmetic expression to generate instruction sets 306 that specify the manner in which instruction processor 112 should operate, at each ALU stage, to evaluate the arithmetic expression.

Accordingly, in examples where a two stage ALU is implemented by instruction processor 112, instruction sets 306 may include various parameters to specify how each stage of the ALU should operate. For instance, instruction sets 306 may identify instructions in a form that includes a first load parameter that specifies values loaded from a local buffer of special purpose IC 108, a second load parameter that specifies a second set of values loaded from a local buffer of special purpose IC 108, a first operation parameter that specifies an operation to be performed in the first ALU stage, and a second operation parameter that specifies an operation to be performed in the second ALU stage. Other parameters may also be included in instruction sets 306, such as a first constant value parameter that specifies a first constant value that may be used during the first ALU stage and a second constant value parameter that specifies a second constant value that may be used during the second ALU stage. Furthermore, a store parameter may also be included in instruction sets 306 that specifies how the result of the second ALU should be output, such as by storing the output in a local buffer of special purpose IC 108 for a subsequent operation. It is noted that the list of parameters described herein is illustrative only, and parameters in addition to those described may also be included in instruction sets 306 that are not expressly described herein. For instance, instruction set generator 304 may provide one or more additional parameters that causes evaluation engine 404 to store intermediate values in local buffer 422 at one or more different, or additional, times as shown in FIG. 4, such as by specifying a store parameter to store intermediate values (e.g., the output of a first operation stage) in the local buffer prior to a second operation being performed. Furthermore, parameters less than those described may be included in instruction sets 306 without departing from the scope of the disclosed embodiments.

FIG. 4 illustrates an example instruction processor 112 that implements a two stage ALU, as described. For instance, instruction receiver 402 of instruction processor 112 may obtain 428 instruction sets 306 that include parameters (e.g., in a form as described earlier). Instruction receiver 402 may then instruct 430 evaluation engine 404 to operate in a manner consistent with the obtained instruction sets 306. As shown in FIG. 4, first input stage 408 may comprise a multiplexer that is configured to select an input set of values that are used during first operation stage 410. In examples, first input stage may select input values obtained from data obtainer 406 or values loaded from local buffer 422, as specified by the first load parameter. Data obtainer 406 may be configured to obtain values for which operations are to be performed that are not already stored in local buffer 422, such as column-oriented database values on which an arithmetic operation is to be performed.

Data obtainer 406 may obtain values from host processing device 104 in various ways, including but not limited to using a direct memory access (DMA) technique. For instance, data obtainer 406 may obtain a physical address a physical address (e.g., a pointer or the like) identifying an address of RAM 118 where values on which operations are to be performed may be obtained. Host processing device 104 may provide the physical address to special purpose IC 108 in various ways, such as by transmitting a packet (e.g., a TLP or PCI packet) using communication channel, using a register write, etc. Upon obtaining such a memory address, data obtainer 406 may obtain the values directly at the provided addresses. Other manners of transferring data are also contemplated, and disclosed embodiments are not limited to this illustrative technique.

In some (but not necessarily all) implementations, data obtainer 406 may obtain such values in a compressed format as described previously. In such examples, data obtainer 406 may be configured to decode the values and store the decoded values in an input buffer or input register local to special purpose IC 108 (e.g., a buffer that is separate from local buffer 422). In other words, where data obtainer 406 decodes values obtained from host processing device 104, the decoded values may be stored automatically in a temporary input register or buffer that may be accessed by evaluation engine 404 (e.g., accessed 432 by first input stage 408).

First input stage 408 may also select 436 values stored in local buffer 422. Local buffer 422 may comprise temporary registers of memory 110 of special purpose IC 108. In some implementations, local buffer 422 may comprise a plurality of buffers (e.g., registers) that may be configured to store batches of values. As will be described in greater detail below, local buffer 422 may be configured to temporarily store intermediate data values, such as data sets that may be used for subsequent operations. While the number of buffers may be relatively small (e.g., 4 buffers) in some implementations, it is contemplated that any number of buffers may exist in special purpose IC 108.

First operation stage 410, shown in FIG. 4, may be configured to perform a first operation, as indicated by the first operation parameter, on the specified data. For instance, first operation stage 410 may selectively perform an arithmetic operation on a set of values obtained 434 from first input stage 408 (e.g., a primary input obtained from an input register or a set of values loaded from local buffer 422). In some implementations, first operation stage 410 may also be configured to perform an arithmetic operation in response to obtaining 438 first constant 418, which may be specified by a first constant value parameter described herein. In some implementations, the first constant value parameter may specify first constant 418 as comprising a zero or null value, indicating that first constant 418 is not utilized for a given operation.

Similarly, second input stage 412 may comprise a multiplexer that is configured to select 440, 442 an appropriate input, such as values loaded from local buffer 422 specified by the second load parameter and/or a second constant 420 specified by a second constant value parameter (which may be set to zero or null in a similar manner as described with respect to the first constant value parameter). Second operation stage 414 may perform an arithmetic operation on one or more sets of data provided to second operation stage 414, including but not limited to values output 444 by first operation stage 410 (which may comprise values obtained and/or decoded by data obtainer 406 and/or values derived therefrom through a first operation) or values obtained 446 from second input stage 412 (e.g., values loaded from local buffer 422 and/or second constant 420). Output stage 416 may be configured to store 448 the result of second operation stage 414 in local buffer 422 as specified by the store parameter (e.g., where further operations may be performed on the output of second operation stage), or may output 452 result 450, which may include a final result of the arithmetic expression to be evaluated, to provide to client application 114. Result 450 may be outputted to a destination memory of computing device 102 (e.g., RAM 118) via a DMA technique or similar technique, or may be outputted to a memory of special purpose IC 108 (e.g., where one or more further operations may be performed on the result).

As described herein, operation of evaluation engine 404, including operations selectively performed at each of the stages, inputs to each stage, and when intermediate results may be stored in local buffer 422, may be identified through parameters provided in instruction sets 306. In example embodiments, instruction sets 306 may comprise instructions compiled for each column of data that is to be combined (or otherwise evaluated) by evaluation engine 404. In other words, first instruction set 308 may be associated with one column of data, second instruction set 310 may be associated with a different column of data, and so on. In this manner, each column of data may be bound to a group of instructions in instruction sets 306, such that evaluation engine 404 may selectively evaluate instructions associated with each such column, store any intermediate results in local buffer 422 as needed, until all operations have been performed and result 450 may be outputted.

It is also noted that instruction set generator 304 of instruction compiler 120 and/or host processing device 104 may generate instruction set 306 in a manner specifying the particular order in which columns of data are retrieved and evaluated. For instance, if an arithmetic expression seeks to combine three columns of data, Column A, Column B, and Column C, instruction set 306 may specify that a column should be fetched first (e.g., Column C), even though the expression may be evaluated by fetching one or more other columns first. By intelligently changing the ordering in which columns of data are fetched, instruction set 306 may enable special purpose IC 108 to reduce the temporary storage needed to hold intermediate values during evaluation of the arithmetic expression, thereby improving its overall performance (e.g., by allowing for increased parallel operations). As will be described in greater detail below, therefore, instruction set generator 304 may compile the arithmetic expression received from client application 114 into a unified and continuous program (e.g., set of instructions) that may be partitioned or grouped for each column of data to be evaluated in the arithmetic expression.

It is noted and understood that although instruction sets 306 may comprise a plurality of parameters that may be configured to specify how evaluation engine 404 may operate (e.g., which inputs to select, what operations to perform at each stage, etc.), evaluation engine 404 need not perform any operations or select values from local buffer 422, or perform other operations as described herein, for one or columns of data. For instance, the set of instructions for a particular set of data (e.g., a column of data) may indicate that evaluation engine should decode the column of data and store the values in buffer 422 without performing any arithmetic operations on the data (e.g., by setting the first and second operation parameters as a "no operation" or null parameter). In other examples, the set of instructions for a particular set of data may identify operations to be performed in only one stage but not the other.

Furthermore, a set of instructions for a particular column of data may also specify that evaluation engine 404 should perform a plurality of cycles or iterations on the same column of data. In other words, while the instruction set may specify that that a particular column of data need only be retrieved and decoded once, it is contemplated that multiple cycles or iterations through evaluation engine 404 (e.g., multiple rounds of multi-stage operations) may be conducted on the same set of decoded values, or values derived therefrom. Stated differently, if evaluation engine 404 comprises two ALUs or operational stages, a set of instructions compiled for a given column of data is not limited to two operational stages, but rather may indicate any number of operations on the column of data (or values derived therefrom, values previously stored in local buffer 422, etc.) by iterating through the two-stage ALU as specified in the instruction set.

As a result, instruction set generator 304 may generate a set of instructions for each column of data such that the decoding or decompression of column values may not need to occur more than once, thus preserving computing resources of special purpose IC 108. Furthermore, the generated set of instructions may specify that uncompressed column values, or values derived therefrom, be stored in local buffer 422 only when required (e.g., when those values may be needed for subsequent operations to complete the evaluation of the arithmetic expression). Where values need not be used for subsequent operations, such values need not be stored in local buffer 422, or may be overwritten with other intermediate values at the same memory addresses of buffer 422 if already stored in the buffer. In this manner, the size of local buffer 422 may be decided by the complexity of the arithmetic expression (e.g., whether intermediate results should be stored for each column of data or values derived therefrom, whether the values can be overwritten, etc.). Accordingly, addresses of local buffer 422 where intermediate values were stored may be released when instruction set generator 304 determines that the cached intermediate values will not be used anymore. Such an approach enables the size of local buffer 422 to be reduced (e.g., the buffer size need not be sized large enough to hold all of the input values for all columns of data), which may increase the number of parallel operations that may be performed simultaneously to evaluate an arithmetic expression.

For instance, as described herein, implementations are not limited to performing operations on singular values during any given stage. Instead, it is contemplated that each point illustrated in evaluation engine 404 may operate on any number of data values (e.g., N data values). For example, data obtainer 406 may obtain and decode a set of N input data values, and store such values in an input register as described. Similarly, first input stage 408 may be configured to receive the N input data values (e.g., from the input register) and load N first data values specified by the first load parameter from a first load address (e.g., from local buffer 422). First operation stage 410 may perform a first operation, as specified by the first operation parameter, on at least the N input data values and the N first data values to produce N first operation stage outputs. Second input stage 412 may similarly be configured to receive N second data values, as specified by the second load parameter, from a second load address (e.g., from local buffer 422). The second load address may be the same as the first load address in some instances, or may comprise a different load address. In example embodiments, such load addresses (first and second load addresses) may comprise memory addresses of registers of special purpose IC 108, such as addresses of local buffer 422. Example techniques for calculating load addresses are described elsewhere herein.

Similar to the first operation stage, second operation stage 414 may be configured to perform a second operation specified by the second operation parameter on at least the N first operation stage outputs and the N second data values to produce N second operation stage outputs. Such N second operation stage outputs may be further outputted, e.g., as result 450 to client application 114, or stored to local buffer 422, as specified by a store parameter received from instruction set generator 304 for subsequent operations. In this manner, evaluation engine 404 may be enabled to perform simultaneous operations on a plurality of data values, thereby improving its performance.

As described herein, the generation of instructions can be performed for each column of data in example embodiments. For instance, referring back to FIG. 2, in step 206, a first set of instructions, that when executed by the integrated-circuit-based processor, may be generated that causes the integrated-circuit-based processor to receive a first column of data and load the first column of data or values derived therefrom into a local buffer. For instance, with reference to FIGS. 3 and 4, instruction set generator 304 may generate first instruction set 308 that comprises first instruction set 308 associated with a first column of data (e.g., one of a plurality of columns of data that may be combined as part of an arithmetic expression). In examples, first instruction set 308 may comprise instructions, that when executed by evaluation engine 404 of instruction processor 112, cause evaluation engine to receive the first column of data and load the first column of data (or values derived therefrom) to local buffer 422.

In other words, as shown in FIG. 4, first instruction set 308 may specify that the first column of data should be stored in local buffer 422. Such an instruction set may be carried out in various ways, including but not limited to obtaining the compressed values of the first column of data by data obtainer 406, placing the decompressed values of the first column of data into an input register, and passing the values of the decompressed first column of data through first operation stage 410 and second operation stage 414 without performing arithmetic operations on the data. In other examples, one or more arithmetic operations may be performed on the decompressed first column of data, such as to scale the values in the first and/or second operational stages using one or more constant values to generate values derived from the second column of data. In such scenarios, the decompressed first column of data, or values derived therefrom, may be stored in local buffer 422 as shown in FIG. 4.

Once instructions in first instruction set 308 are executed, evaluation engine 404 may proceed to execute instructions contained in second instruction set 310 (e.g., to selectively perform operations with respect to a second column of data, or a sub-batch thereof). Although examples embodiments are described herein that instruction sets 306 contain different sets of instructions with respect to each column of data, it is understood that such instruction sets (e.g., first instruction set 308, second instruction set 310, and so on) need not be expressly designated in instruction set 306. In other words, instruction set 306 need not expressly indicate the beginning or ending of the portion of instruction set 306 associated with a particular column of data. Rather, instruction set 306 may comprise a unified and continuous program that evaluation engine 404 may execute, where the program may comprise different portions (e.g., groups, partitions, etc.) associated with different columns of data.

It is also noted that while data obtainer 406 need not be configured to decode incoming data in some implementations. For instance, while techniques described herein may be applicable where columns of data are received in a compressed or encoded format, techniques are also applicable in other implementations, such as where data may not be stored in a compressed or encoded format, where decoding may occur by another entity (not expressly shown) in special purpose IC 108 and/or computing device 102, or otherwise where decoding of data is not needed. Thus, in such examples where decoding is not needed, it is understood that the incoming data may still be placed in an input register or the like, which may later be accessed by the first input stage 408 and/or second input stage 414, as specified by the generated instructions.

In step 208, a second set of instructions, that when executed by the integrated-circuit-based processor, may be generated for a second column of data. The second set of instructions may specify a number of actions, including receiving the second column of data, combining the received second column of data or values derived therefrom with the first column of data or values derived therefrom retrieved from the local buffer to produce an intermediate column of data that is stored in the local buffer, and combining the received second column of data or values derived therefrom with the intermediate column of data that is retrieved from the local buffer to produce a combined column of data. For instance, with reference to FIG. 3, instruction set generator 304 may generate second instruction set 310 to perform the aforementioned actions with respect to the second column of data.

As noted earlier, instruction set generator 304 may be configured to compile instructions for the arithmetic expression that specifies a particular ordering in which instructions for each column of data are executed. Thus, while example embodiments are described herein in which the first set of instructions may be associated with a first column of data and a second set of instructions may be associated with a second column of data, instruction set generator 304 may be configured to generate instructions in a different manner (e.g., change the ordering such that instructions associated with the second column of data are executed prior to instructions associated with the first column of data) for various reasons, including but not limited to, preserving memory utilization by evaluation engine 404.

As shown in FIG. 4, for example, second instruction set 310 may comprise an instruction, that when executed by evaluation engine 404, causes evaluation engine to receive the second column of data. The second column of data may be retrieved by in a similar manner as described above with respect to the retrieval of the first column of data. For instance, data obtainer 406 may be instructed to retrieve the second column in a compressed format, decompress the second column of data, and temporarily store the decompressed values of the second column of data in an input register. Second instruction set 310 may also specify one or more operations to be performed with respect to the second column of data (or values derived therefrom, such as a scaled value of the second column of data). For instance, evaluation engine 404 may combine the received second column of data (e.g., which may be stored in an input register or the like following decompression by data obtainer 406 where appropriate) with the first column of data, or values derived therefrom, retrieved from local buffer 422. Such an operation may be performed either at first operation stage 410 and/or second operation stage 414 of evaluation engine 404. In other words, first input stage 408 may select the first column of data, or values derived therefrom, previously stored in local buffer 422 and pass such values along with the retrieved second column of data to first operation stage 410 where an arithmetic operation may be performed to combine the two sets of data. In another example, second input stage 412 may similarly select the first column of data, or values derived therefrom, previously stored in local buffer 422 and pass such values along with the retrieved second column of data to second operation stage 414 where the arithmetic operation may be performed to combine the two sets of data.

The output of the arithmetic operation (whether performed in the first stage or second stage) may comprise an intermediate column of data that may be stored in local buffer 422. In examples, the intermediate column of data stored in local buffer 422 may be stored at the same address that previously stored the first column of data. In other words, where the first column of data (or values derived therefrom) are no longer needed for subsequent operations by evaluation engine 404, such values may be overwritten with intermediate values produced by subsequent operations. It is noted, however, that this example is illustrative only, and in other implementations, different address locations may also be utilized, such as where the first column of data may still be needed for subsequent operations.

As described earlier, second instruction set 310 may also comprise instructions to perform one or more additional arithmetic operations on the same set of data retrieved previously. For instance, second instruction set 310 may comprise an instruction, that when executed by evaluation engine 404, causes evaluation engine 404 to receive the second column of data (e.g., values previously obtained and/or decoded by data obtainer 406 and stored in an input buffer) or values derived therefrom (e.g., scaled values of the second column of data that may be performed through an operation in first operation stage 410) with the intermediate column of data retrieved from local buffer 422. In other words, the same set of data previously received and decompressed (e.g., the second column of data or values derived therefrom) may be used for one or more subsequent operations (without performing a duplicative decompression), such as combining that set of data with another set of data stored in local buffer 422 to produce a combined column of data. Such a combined column of data may be produced at first operation stage 410, second operation stage 414, or any other operational stage not expressly illustrated in FIG. 4. In examples, if the combined column of data represents the final result of the arithmetic expression to be evaluated (i.e., no additional subsequent operations need to be performed on the combined column of data), result 450 may be provided to client application 114.

A non-limiting example is described to illustrate the techniques described herein. For instance, an arithmetic operation may seek the result of a combination of two column of data (Column A and Column B): Column B*Column A+Column A. In such an illustrative example, instruction set generator 304 may compile two sets of instructions: first instruction set 308 corresponding to Column B (i.e., the first column of data), and second instruction set 310 corresponding to Column A (i.e., the second column of data). First instruction set 308 may comprise one or more instructions to cause evaluation engine 404 to obtain Column B, decode Column B, and store the decoded values of Column B into local buffer 422. Second instruction set 310 may comprise instructions to cause evaluation engine to obtain Column A, decode Column A, obtain Column B from local buffer 422, and multiply the decoded values of Column A with the values of Column B. Second instruction set 310 may also comprise instructions to store the multiplied values of Column A and Column B at the same address locations that were previously used to store the values of Column B, since values of Column B are no longer needed for any subsequent operations. Second instruction set 310 may also comprise instructions that cause evaluation engine to obtain the previously decoded values of Column A, which may be stored in a temporary input register, and add those values to values stored in local buffer 422 that contains the multiplied result of Column A and Column B to produce a combined column of data, which may be output as result 450.

As illustrated in this non-limiting example, Column B may drive one instruction to store the values of decoded values of Column B that may be temporarily stored in a special input register to a local buffer, while Column A may drive several instructions to multiply the values in the local buffer by the decoded values of Column A, store the result back to the local buffer, add the values of the special input register (which temporarily stores the previously decoded values of Column A) with the values in the local buffer, and output the result (which may be output to an output register that is subsequently provided to client application 114). In this manner, even though the decoded values of column A are used for multiple operations, the decoding operation need only be performed once. Furthermore, the decoded values of Column A may be obtained from the special input register, rather than storing such values in local buffer 422. As a result, buffer space may utilized more efficiently, thereby allowing increased parallelism when performing multiple batches of operations simultaneously.

In other illustrative examples, as depicted in FIG. 4 and described elsewhere herein, one or more operational stages of evaluation engine 404 may perform arithmetic operations on columns of data (values stored in an input register, a local buffer, or any other intermediate values) may comprise operations using one or more constant values, such as first constant 418 and/or second constant 420. For instance, where an arithmetic expression requires that certain values be scaled during evaluation, first constant 418 and/or second constant 420 may comprise a scaling value that may be selected by first input stage 408 and/or second input stage 412, respectively, to perform the appropriate scaling operation. Accordingly, it is contemplated that in some example implementations, the first operational stage may be used for scaling a set of values, while a second operational stage may be used for other arithmetic operations to evaluate an arithmetic expression. Such an approach allows for intermediate values (e.g., scaled values) to be utilized for subsequent operations in a subsequent operational stage without requiring that the scaled values be stored in local buffer 422, thus preserving the memory required for local buffer 422. This is only one illustrative example, however, and is not intended to limit the scope of the disclosed embodiments.

As described above, data values may be stored on computing device 102 in a compressed or encoded format that may need to be decompressed prior to evaluating an arithmetic expression. For example, FIG. 5 shows a flowchart of a method for generating instructions to evaluate an arithmetic expression, according to an example embodiment. In an implementation, the method of flowchart 500 may be implemented by instruction set generator 304. FIG. 5 is described with continued reference to FIGS. 3 and 4. Other structural and operational implementations will be apparent to persons skilled in the relevant art(s) based on the following discussion regarding flowchart 500, system 300, and system 400 of FIGS. 3 and 4.

Flowchart 500 begins with step 502. In step 502, an instruction is generated to cause an integrated-circuit-based processor to generate a decompressed column of data and load the decompressed column of data to a local buffer. For instance, with reference to FIGS. 3 and 4, instruction set generator 304 may be configured to generate an instruction as part of instruction sets 306, that when executed by evaluation engine 404, causes evaluation engine 404 to decompress a column of data associated with the expression to be evaluated, and load the decompressed column of data into local buffer 422.

As described earlier, computing device 102 may store database values in a columnar format that is compressed using one or more compression algorithms, including but not limited to RLE, bit-packing, hash dictionary compression, or other compression techniques known and appreciated to those skilled in the relevant arts. In order to evaluate an arithmetic expression that combines one or more columns of data, instruction sets 306 may comprise an instruction to cause data obtainer 406 of evaluation engine 404 to obtain and decompress the column of data using a suitable algorithm. The decompressed column of data may be stored temporarily in a special input register or buffer upon decompression in example implementations. In some further implementations (such as in the illustrative example described earlier which combines Column A and Column B), the decompressed column of data may be loaded into local buffer 422.

The loading of the decompressed column of data into local buffer 422 may be accomplished in various ways, such as by passing the decompressed value through evaluation engine 404 without performing further arithmetic operations on the data, and storing decompressed value in local buffer 422. It is also noted, however, that either first operation stage 410 and/or second operation stage 414 may perform arithmetic operations prior to storing values into local buffer 422, such as a scaling operation as described previously. In such examples, therefore, local buffer 422 may be populated with the decompressed column of data or values derived therefrom (e.g., scaled values).

As described above, a combined column of data may be outputted by evaluation engine 404 in various ways. For example, FIG. 6 shows a flowchart of a method for generating an instruction to output a combined column of data to a memory of an integrated-circuit-based processor, according to an example embodiment. In an implementation, the method of flowchart 600 may be implemented by instruction set generator 304. FIG. 6 is described with continued reference to FIGS. 3 and 4. Other structural and operational implementations will be apparent to persons skilled in the relevant art(s) based on the following discussion regarding flowchart 600, system 300, and system 400 of FIGS. 3 and 4.

Flowchart 600 begins with step 602. In step 602, an instruction is generated, that when executed by an integrated-circuit-based processor, causes the integrated-circuit-based processor to output the column of data to a destination memory. For instance, with reference to FIGS. 3 and 4, upon selectively performing one or more operations at various ALU stages to combine two columns of data, instruction set generator 304 may generate an instruction that specifies that output stage 416 should output the combined column of data to a destination memory. In some examples, the designation memory may comprise a memory local to special purpose IC 108. In other words, instruction set generator 304 may generate an instruction that, when executed at output stage 416, causes the combined column of data to be stored in local buffer 422. Such an instruction may be generated, for instance, where one or more subsequent operations are to be performed on the combined column of data, such as further combining the combined column of data with another column of data, performing an aggregation operation, etc.

In other examples, such as where the combined column of data represents the final result of the arithmetic expression to be evaluated (i.e., no further arithmetic operations need be performed on the combined column of data), output stage 416 may be instructed, via an appropriate instruction generated by instruction set generator 304, to output the combined column of data to a destination memory (e.g., RAM 118) that may be accessed by client application 114 of computing device 102. Outputting the combined column of data to such a destination memory may be carried out in various ways, including but not limited to a DMA technique, or otherwise transmitting information over a channel that couples special purpose IC 108 and host processing device 104 (e.g., by transmitting a TLP or PCI packet or the like, using a register write, etc.). Other manners of transferring data are also contemplated, and disclosed embodiments are not limited to these illustrative examples.

In some example embodiments, an arithmetic expression may be carried out in sub-batches, which may conserve memory resources and/or enhance performance. For example, FIG. 7 shows a flowchart of a method for dividing an arithmetic expression into a plurality of sub-batches, according to an example embodiment. In an implementation, the method of flowchart 700 may be implemented by evaluation engine 404. FIG. 7 is described with continued reference to FIGS. 3 and 4. Other structural and operational implementations will be apparent to persons skilled in the relevant art(s) based on the following discussion regarding flowchart 600, system 300, and system 400 of FIGS. 3 and 4.

Flowchart 700 begins with step 702. In step 702, an arithmetic expression may be divided into a plurality of sub-batches for execution, each sub-batch being executed in parallel with each other. For instance, upon receiving instruction sets 306, instruction receiver 402 may determine that execution of instruction contained within instruction sets 306 may be performed with greater efficiency (or for any other reason). In such an example, instruction receiver 402 may divide the arithmetic operation into sub-batches of data, where each sub-batch of data may be evaluated by evaluation engine 404 in parallel with each other. In other words, instruction processor 112 may comprise a plurality of evaluation engines similar to evaluation engine 404, each of which may be configured to execute instructions in parallel with each other on different sub-batches of a larger data set.

For instance, evaluation engine 404 may be configured to perform parallel operations on using a N-way single instruction multiple data (SIMD) approach, where instruction receiver 402 may receive a single overall set of instructions (e.g., instruction sets 306) and perform parallel operations in response. In other words, evaluation engine 404 may be configured to perform the same operations as defined by instruction sets 306 on different sub-batches of data (e.g., different sub-batches of rows for the same column). For instance, if two column of data are to be combined in an arithmetic expression, a first set of instructions associated with the first column of data and a second set of instructions associated with the second column of data may be generated as described above. When the first set of instructions is executed, a sub-batch of the first column of data (e.g., a subset of values of the first column of data) may be retrieved, and operations may be performed on the sub-batch of first column of data in accordance the first set of instructions. The second set of instructions may then be executed when a sub-batch of the second column of data is received (e.g., a subset of values of the second column of data), and operations may be performed with respect to the sub-batch of the second column of data (e.g., an operation that may combine the sub-batch of the first column of data with the sub-batch of the second column of data). If only two column of data are part of the arithmetic expression, the instruction set (e.g., the first and second sets of instructions) may be executed again, for each different sub-batch of data. In other words, the first set of instructions may be executed again for a different sub-batch of the first column of data, and the second set of instructions may be executed again for a different sub-batch of the second column of data, until all of the sub-batches of the columns of data are evaluated.

As described above, such operations (e.g., first and second instruction sets, if only two columns of data are involved in an express) on different sub-batches of data may be performed in parallel. In this manner, since multiple parallel computations may be performed simultaneously, performance of evaluation engine 404 may be improved. In example embodiments, each stage, such as first operation stage 410, second operation stage 414, and/or any additional stages not expressly shown, may compute an N-way SIMD integer computation, such as a 32-bit, 64-bit (or any other bit) addition, subtraction, multiplication, division, or other arithmetic computation. Furthermore, to ensure complete and/or correct processing, evaluation engine 404 may also be configured to appropriately handle non-integer values (e.g., null values) and/or other computational issues, such as computational overflows, by setting one or more appropriately dedicated flags.

As an illustration, instruction receiver 402 may receive instruction sets 306 that comprises instruction to evaluate an arithmetic expression for a batch columnar store data (e.g., 5000 rows of columnar data). Instruction receiver 402 may be configured to divide the operations such that evaluation engine 404 performs operations in smaller sub-batches (e.g., 100 rows at a time, or any other value that may maximize the operational efficiency of evaluation engine 404). In such examples, intermediate values produced during first operation stage 410 and/or second operation stage 414 that are to be stored in local buffer 422 may be stored for each sub-batch, such as sub-batch 426A, sub-batch 426B, and so on. In other words, each sub-batch of data may be assigned a particular sub-batch ID, and storage of intermediate values in buffer 422 may be associated with the corresponding sub-batch ID.

In some example implementations, evaluation engine 404 may be configured to calculate load and/or store addresses on-the-fly using row identifiers and/or column identifiers. However, in some other implementations, such as where sub-batches are executed in parallel, load and store addresses may also be calculated using sub-batch IDs in addition to row and column IDs. For instance, evaluation engine 404 may be configured to implement pointer-arithmetic techniques as appreciated by those skilled in the relevant arts to calculate or determine address to which intermediate values may be stored in local buffer 422 and/or from which intermediate values may be loaded from local buffer 422. Stated differently, one or more subcomponents of evaluation engine 404 may be configured to calculate the appropriate address of local buffer 422 based on the row ID, column ID, and sub-batch ID for which an operation is being performed.

It is noted that while sub-batch IDs may not be implemented in some embodiments, sub-batch IDs may allow for further improvements in performance. For instance, row and column IDs may be assigned in a manner that is local to instruction processor 112 (e.g., each batch in the above illustration may be assigned row IDs of 0-99, rather than row IDs ranging from 0-4999), as well as a corresponding sub-batch ID. Such an approach may simplify the manner in which pointer arithmetic is performed to identify store and load address locations, thereby further improving performance.

III. Example Mobile and Stationary Device Embodiments

Computing device 102, host processing device 104, host memory 106, special purpose IC 108, memory 110, instruction processor 112, client application 114, storage device 116, RAM 118, instruction compiler 120, expression receiver 302, instruction set generator 304, instruction receiver 402, evaluation engine 404, data obtainer 406, first stage input 408, first operation stage 410, second input stage 412, second operation stage 414, output stage 416, first constant 418, second constant 420, local buffer 422, flowchart 200, flowchart 500, flowchart 600, and/or flowchart 700 may be implemented in hardware or be implemented as hardware logic/electrical circuitry (e.g., electrical circuits comprised of transistors, logic gates, operational amplifiers, one or more application specific integrated circuits (ASICs), one or more field programmable gate arrays (FPGAs)). For example, one or more of computing device 102, host processing device 104, host memory 106, special purpose IC 108, memory 110, instruction processor 112, client application 114, storage device 116, RAM 118, instruction compiler 120, expression receiver 302, instruction set generator 304, instruction receiver 402, evaluation engine 404, data obtainer 406, first stage input 408, first operation stage 410, second input stage 412, second operation stage 414, output stage 416, first constant 418, second constant 420, local buffer 422, flowchart 200, flowchart 500, flowchart 600, and/or flowchart 700 may be implemented separately or together in a system on a chip (SoC). The SoC may include an integrated circuit chip that includes one or more of a processor (e.g., a central processing unit (CPU), microcontroller, microprocessor, digital signal processor (DSP), etc.), memory, one or more communication interfaces, and/or further circuits, and may optionally execute received instructions and/or include embedded firmware to perform functions. Further, client application 114, instruction compiler 120, expression receiver 302, and/or instruction set generator 304 may be implemented in hardware combined with software and/or firmware, such as being implemented as computer code/instructions stored in a physical/hardware-based computer readable storage medium and configured to be executed in one or more processors.

Figure 8:
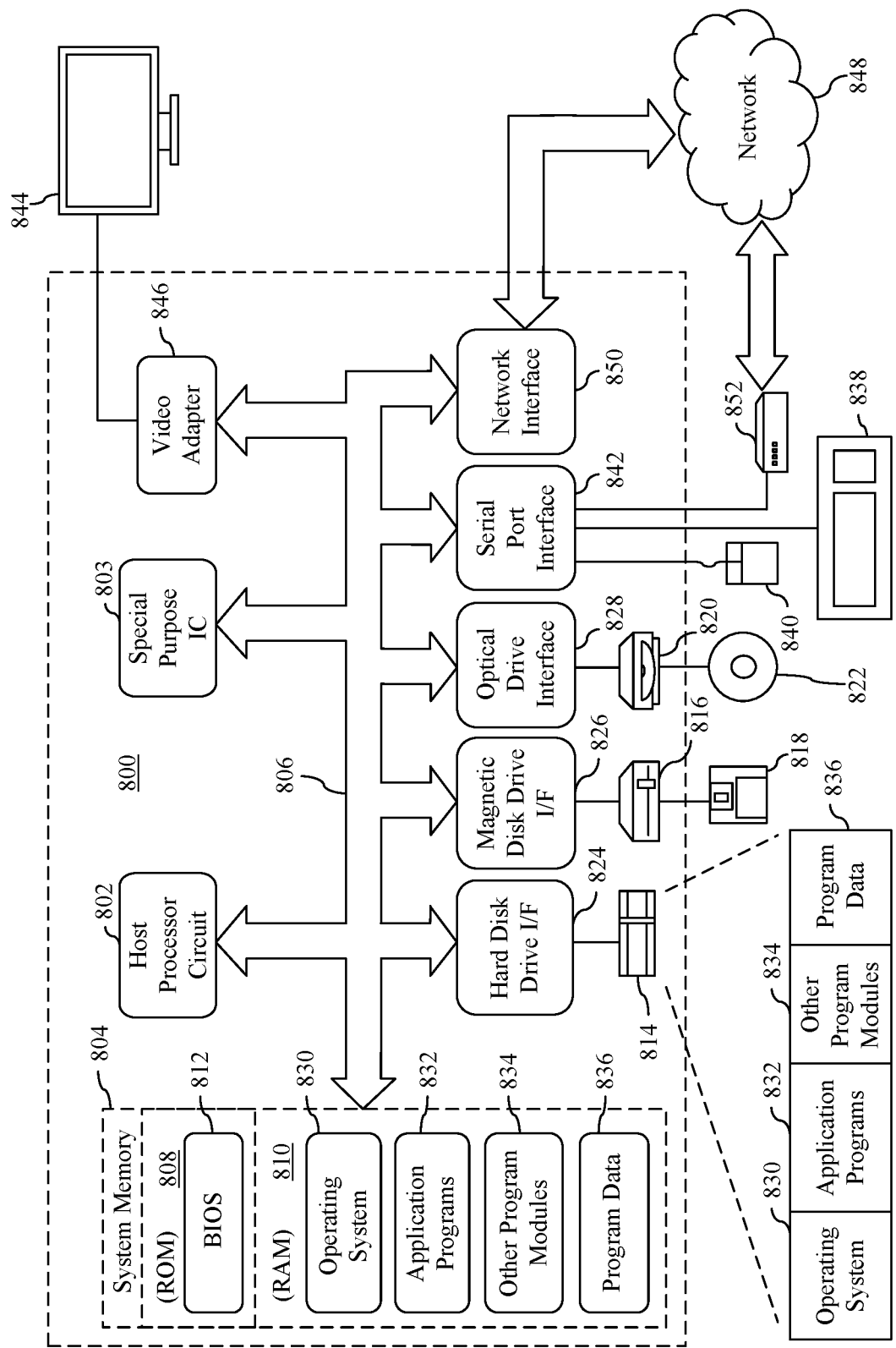
FIG. 8 shows a block diagram of an example computing device that may be used to implement example embodiments.

FIG. 8 depicts an exemplary implementation of a computing device 800 in which example embodiments may be implemented. For example, any of computing device 102, host processing device 104, host memory 106, special purpose IC 108, memory 110, instruction processor 112, client application 114, storage device 116, RAM 118, instruction compiler 120, expression receiver 302, instruction set generator 304, instruction receiver 402, evaluation engine 404, data obtainer 406, first stage input 408, first operation stage 410, second input stage 412, second operation stage 414, output stage 416, first constant 418, second constant 420, and/or local buffer 422 may be implemented in one or more components of computing device 800 in stationary or mobile computer embodiments. The description of computing device 800 provided herein is provided for purposes of illustration, and is not intended to be limiting. Example embodiments may be implemented in further types of computer systems, as would be known to persons skilled in the relevant art(s).

As shown in FIG. 8, computing device 800 includes one or more processors, referred to as host processor circuit 802, a special purpose IC 803, a system memory 804, and a bus 806 that couples various system components including system memory 804, host processor circuit 802, and/or special purpose IC 803. Host processor circuit 802 and/or special purpose IC 803 is an electrical and/or optical circuit implemented in one or more physical hardware electrical circuit device elements and/or integrated circuit devices (semiconductor material chips or dies) as a central processing unit (CPU), a microcontroller, a microprocessor, and/or other physical hardware processor circuit. In examples, any suitable actions performed by host processing device 104 in connection with one or more steps of flowchart 200, 500, 600, and/or 700 may be performed by host processor circuit 802. Host processor circuit 802 may execute program code stored in a computer readable medium, such as program code of operating system 830, application programs 832, other programs 834, etc.

Special purpose IC 803 may be an example of special purpose IC 108 described herein. For instance, any one or more of instruction receiver 402, evaluation engine 404, data obtainer 406, first stage input 408, first operation stage 410, second input stage 412, second operation stage 414, output stage 416, first constant 418, second constant 420, and/or local buffer 422 may be implemented in special purpose IC 803. Furthermore, any suitable step(s) of flowchart 200, 500, 600, and/or 700 performed by special purpose IC 108 described herein may be performed by special purpose IC 803 (e.g., in hardware). Bus 806 represents one or more of any of several types of bus structures, including a memory bus or memory controller, a peripheral bus, an accelerated graphics port, and a processor or local bus using any of a variety of bus architectures. System memory 804 includes read only memory (ROM) 808 and random-access memory (RAM) 810. A basic input/output system 812 (BIOS) is stored in ROM 808.

Computing device 800 also has one or more of the following drives: a hard disk drive 814 for reading from and writing to a hard disk, a magnetic disk drive 816 for reading from or writing to a removable magnetic disk 818, and an optical disk drive 820 for reading from or writing to a removable optical disk 822 such as a CD ROM, DVD ROM, or other optical media. Hard disk drive 814, magnetic disk drive 816, and optical disk drive 820 are connected to bus 806 by a hard disk drive interface 824, a magnetic disk drive interface 826, and an optical drive interface 828, respectively. The drives and their associated computer-readable media provide nonvolatile storage of computer-readable instructions, data structures, program modules and other data for the computer. Although a hard disk, a removable magnetic disk and a removable optical disk are described, other types of hardware-based computer-readable storage media can be used to store data, such as flash memory cards, digital video disks, RAMs, ROMs, and other hardware storage media.

A number of program modules may be stored on the hard disk, magnetic disk, optical disk, ROM, or RAM. These programs include operating system 830, one or more application programs 832, other programs 834, and program data 836. Application programs 832 or other programs 834 may include, for example, computer program logic (e.g., computer program code or instructions) for implementing client application 114, instruction compiler 120, expression receiver 302, instruction set generator 304, flowchart 200, flowchart 500, flowchart 600, and/or flowchart 700 (including any suitable step of flowcharts 200, 500, 600, or 700) and/or further example components described herein.

A user may enter commands and information into the computing device 800 through input devices such as keyboard 838 and pointing device 840. Other input devices (not shown) may include a microphone, joystick, game pad, satellite dish, scanner, a touch screen and/or touch pad, a voice recognition system to receive voice input, a gesture recognition system to receive gesture input, or the like. These and other input devices are often connected to host processor circuit 802 through a serial port interface 842 that is coupled to bus 806, but may be connected by other interfaces, such as a parallel port, game port, or a universal serial bus (USB).

A display screen 844 is also connected to bus 806 via an interface, such as a video adapter 846. Display screen 844 may be external to, or incorporated in computing device 800. Display screen 844 may display information, as well as being a user interface for receiving user commands and/or other information (e.g., by touch, finger gestures, virtual keyboard, etc.). In addition to display screen 844, computing device 800 may include other peripheral output devices (not shown) such as speakers and printers.

Computing device 800 is connected to a network 848 (e.g., the Internet) through an adaptor or network interface 850, a modem 852, or other means for establishing communications over the network. Modem 852, which may be internal or external, may be connected to bus 806 via serial port interface 842, as shown in FIG. 8, or may be connected to bus 806 using another interface type, including a parallel interface.

As used herein, the terms "computer program medium," "computer-readable medium," and "computer-readable storage medium" are used to refer to physical hardware media such as the hard disk associated with hard disk drive 814, removable magnetic disk 818, removable optical disk 822, other physical hardware media such as RAMs, ROMs, flash memory cards, digital video disks, zip disks, MEMs, nano-technology-based storage devices, and further types of physical/tangible hardware storage media. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Example embodiments are also directed to such communication media that are separate and non-overlapping with embodiments directed to computer-readable storage media.

As noted above, computer programs and modules (including application programs 832 and other programs 834) may be stored on the hard disk, magnetic disk, optical disk, ROM, RAM, or other hardware storage medium. Such computer programs may also be received via network interface 850, serial port interface 842, or any other interface type. Such computer programs, when executed or loaded by an application, enable computing device 800 to implement features of example embodiments described herein. Accordingly, such computer programs represent controllers of the computing device 800.

Computing device 800 may also include computer program products comprising computer code or instructions stored on any computer-readable medium. Such computer program products include hard disk drives, optical disk drives, memory device packages, portable memory sticks, memory cards, and other types of physical storage hardware.

IV. Example Embodiments

A compiler system for compiling an instruction set for an evaluation engine is disclosed herein. The system includes: one or more processors; and one or more memory devices that store program code configured to be executed by the one or more processors, the program code comprising instructions for: receiving an arithmetic expression that combines a result of a combination of a first column of data and a second column of data with the second column of data; and generating instructions that, when executed by an integrated-circuit-based processor, cause the integrated-circuit-based processor to evaluate the arithmetic expression, the generating the instructions comprising: generating a first set of instructions, that when executed by the integrated-circuit-based processor, causes the integrated-circuit-based processor to receive the first column of data and load the first column of data or values derived therefrom into a local buffer thereof; and generating a second set of instructions, that when executed by the integrated-circuit-based processor, causes the integrated circuit-based processor to: receive the second column of data into an input buffer, combine the received second column of data from the input buffer or values derived therefrom with the first column of data or values derived therefrom retrieved from the local buffer to produce an intermediate column of data that is stored in the local buffer, and combine the received second column of data from the input buffer or values derived therefrom with the intermediate column of data that is retrieved from the local buffer to produce a combined column of data.

In one implementation of the foregoing system, the generating the first set of instructions, that when executed by the integrated-circuit-based processor, causes the integrated-circuit-based processor to receive the first column of data comprises generating a decompressed first column of data and loading the decompressed first column of data into the local buffer.

In another implementation of the foregoing system, the integrated-circuit-based processor comprises a CPU of a host device.

In another implementation of the foregoing system, the integrated-circuit-based processor comprises a special purpose IC that includes one of an FPGA or ASIC device.

In another implementation of the foregoing system, the second set of instructions further includes an instruction to cause the special-purpose IC to output the combined column of data to a destination memory.

In another implementation of the foregoing system, the local buffer comprises a register of the special purpose IC.

In another implementation of the foregoing system, the generating the instructions are performed on a host device that is separate from the integrated-circuit-based processor.

In another implementation of the foregoing system, the second set of instructions further includes an instruction to cause the integrated-circuit-based processor to output the combined column of data to the host device.

A method performed by a computing device for generating an instruction set for an evaluation engine is disclosed herein. The method includes: receiving an arithmetic expression that combines a result of a combination of a first column of data and a second column of data with the second column of data; and generating instructions that, when executed by an integrated-circuit-based processor, cause the integrated-circuit-based processor to evaluate the arithmetic expression, the generating the instructions comprising: generating a first set of instructions, that when executed by the integrated-circuit-based processor, causes the integrated-circuit-based processor to receive the first column of data and load the first column of data or values derived therefrom into a local buffer thereof; and generating a second set of instructions, that when executed by the integrated-circuit-based processor, causes the integrated circuit-based processor to: receive the second column of data into an input buffer, combine the received second column of data from the input buffer or values derived therefrom with the first column of data or values derived therefrom retrieved from the local buffer to produce an intermediate column of data that is stored in the local buffer, and combine the received second column of data from the input buffer or values derived therefrom with the intermediate column of data that is retrieved from the local buffer to produce a combined column of data.

In one implementation of the foregoing method, the generating the first set of instructions, that when executed by the integrated-circuit-based processor, causes the integrated-circuit-based processor to receive the first column of data comprises generating a decompressed first column of data and loading the decompressed first column of data into the local buffer.

In another implementation of the foregoing method, the integrated-circuit-based processor comprises a special purpose IC that includes one of an FPGA or ASIC device.

In another implementation of the foregoing method, the second set of instructions further includes an instruction to cause the special-purpose IC to output the combined column of data to a destination memory.

In another implementation of the foregoing method, the local buffer comprises a register of the special purpose IC.

In another implementation of the foregoing method, the generating the instructions are performed on a host device that is separate from the integrated-circuit-based processor.

A method performed by integrated circuit evaluation engine is disclosed herein. The method includes: receiving instructions to evaluate an arithmetic expression that combines a result of a combination of a first column of data and a second column of data with the second column of data, the received instructions comprising a first set of instructions and a second set of instructions; executing the first set of instructions, the executing the first set of instructions comprising: receiving data values of the first column of data and loading the data values of the first column of data or values derived therefrom into a local buffer thereof; executing the second set of instructions, the executing the second set of instructions comprising: receiving data values of the second column of data into an input buffer, combining the received data values of the second column of data from the input buffer or values derived therefrom with the values retrieved from the local buffer to produce an intermediate column of data that is stored in the local buffer, and combining the received data values of the second column of data from the input buffer or values derived therefrom with the intermediate column of data retrieved from the local buffer to produce a combined column of data.

In one implementation of the foregoing method, the data values of the first column of data comprises a subset of values of the first column of data, and the data values of the second column of data comprises a subset of values of the second column of data.

In another implementation of the foregoing method, the method further includes: dividing the arithmetic expression into a first sub-batch and a second sub batch, wherein: the executing the first set of instructions comprises executing a first set of instructions for the first sub-batch in parallel with executing a first set of instructions for the second sub-batch; and the executing the second set of instructions comprises executing a second set of instructions for the first sub-batch in parallel with executing a second set of instructions for the second sub-batch.

In another implementation of the foregoing method, the executing the first set of instructions and executing the second set is performed in a special purpose IC that includes one of a FPGA or ASIC device.

In another implementation of the foregoing method, the receiving the instructions to evaluate the arithmetic expression comprises receiving the instructions from a host processing device.

In another implementation of the foregoing method, the instructions comprises an instruction to combine a constant value with at least one of a value from the input buffer or a value retrieved from a local buffer.

V. Conclusion

While various embodiments of the disclosure have been described above, it should be understood that they have been presented by way of example only, and not limitation. It will be understood by those skilled in the relevant art(s) that various changes in form and details may be made therein without departing from the spirit and scope of the disclosure as defined in the appended claims. Accordingly, the breadth and scope of the disclosure should not be limited by any of the above-described exemplary embodiments, but should be defined only in accordance with the following claims and their equivalents.

What is claimed is:

1. A compiler system for compiling an instruction set for an evaluation engine, comprising:
   one or more processors; and
   one or more memory devices that store program code configured to be executed by the one or more processors, the program code comprising instructions for:
      receiving an arithmetic expression that combines a result of a combination of a first column of data and a second column of data with the second column of data; and
      generating additional instructions that, when executed by an integrated-circuit-based processor, cause the integrated-circuit-based processor to evaluate the arithmetic expression, the generating the additional instructions comprising:
         generating a first set of instructions, that when executed by the integrated-circuit-based processor, causes the integrated-circuit-based processor to receive the first column of data and load the first column of data or values derived therefrom into a local buffer thereof; and
         generating a second set of instructions, that when executed by the integrated-circuit-based processor, causes the integrated circuit-based processor to:
            receive the second column of data into an input buffer,
            combine the received second column of data from the input buffer or values derived therefrom with the first column of data or the values derived therefrom retrieved from the local buffer to produce an intermediate column of data that is stored in the local buffer, and
            combine the received second column of data from the input buffer or the values derived therefrom with the intermediate column of data that is retrieved from the local buffer to produce a combined column of data.

2. The compiler system of claim 1, wherein generating the first set of instructions, that when executed by the integrated-circuit-based processor, causes the integrated-circuit-based processor to receive the first column of data comprises generating a decompressed first column of data and loading the decompressed first column of data into the local buffer.

3. The compiler system of claim 1, wherein the integrated-circuit-based processor comprises a central processing unit (CPU) of a host device.

4. The compiler system of claim 1, wherein the integrated-circuit-based processor comprises a special purpose integrated circuit (IC) that includes one of a field-programmable gate array (FPGA) or an application-specific integrated circuit (ASIC) device.

5. The compiler system of claim 4, wherein the second set of instructions further includes an instruction to cause the special-purpose IC to output the combined column of data to a destination memory.

6. The compiler system of claim 4, wherein the local buffer comprises a register of the special purpose IC.

7. The compiler system of claim 1, wherein the generating the additional instructions are performed on a host device that is separate from the integrated-circuit-based processor.

8. The compiler system of claim 7, wherein the second set of instructions further includes an instruction to cause the integrated-circuit-based processor to output the combined column of data to the host device.

9. A method performed by a computing device for generating an instruction set for an evaluation engine, comprising:
   receiving an arithmetic expression that combines a result of a combination of a first column of data and a second column of data with the second column of data; and
   generating instructions that, when executed by an integrated-circuit-based processor, cause the integrated-circuit-based processor to evaluate the arithmetic expression, the generating the instructions comprising:
      generating a first set of instructions, that when executed by the integrated-circuit-based processor, causes the integrated-circuit-based processor to receive the first column of data and load the first column of data or values derived therefrom into a local buffer thereof; and
      generating a second set of instructions, that when executed by the integrated-circuit-based processor, causes the integrated circuit-based processor to:
         receive the second column of data into an input buffer,
         combine the received second column of data or values from the input buffer derived therefrom with the first column of data or the values derived therefrom retrieved from the local buffer to produce an intermediate column of data that is stored in the local buffer, and combine the received second column of data from the input buffer or the values derived therefrom with the intermediate column of data that is retrieved from the local buffer to produce a combined column of data.

10. The method of claim 9, wherein generating the first set of instructions, that when executed by the integrated-circuit-based processor, causes the integrated-circuit-based processor to receive the first column of data comprises generating a decompressed first column of data and loading the decompressed first column of data into the local buffer.

11. The method of claim 9, wherein the integrated-circuit-based processor comprises a special purpose integrated circuit (IC) that includes one of a field-programmable gate array (FPGA) or an application-specific integrated circuit (ASIC) device.

12. The method of claim 11, wherein the second set of instructions further includes an instruction to cause the special-purpose IC to output the combined column of data to a destination memory.

13. The method of claim 11, wherein the local buffer comprises a register of the special purpose IC.

14. The method of claim 9, wherein the generating the instructions are performed on a host device that is separate from the integrated-circuit-based processor.

15. A method performed by integrated circuit evaluation engine, comprising:
   receiving instructions to evaluate an arithmetic expression that combines a result of a combination of a first column of data and a second column of data with the second column of data, the received instructions comprising a first set of instructions and a second set of instructions;
   executing the first set of instructions, the executing the first set of instructions comprising:
      receiving data values of the first column of data and loading the data values of the first column of data or values derived therefrom into a local buffer thereof;
   executing the second set of instructions, the executing the second set of instructions comprising:
      receiving data values of the second column of data into an input buffer,
      combining the received data values of the second column of data from the input buffer or values derived therefrom with the data values of the first column of data or values derived therefrom retrieved from the local buffer to produce an intermediate column of data that is stored in the local buffer, and
      combining the received data values of the second column of data from the input buffer or the values derived therefrom with the intermediate column of data retrieved from the local buffer to produce a combined column of data.

16. The method of claim 15, wherein the data values of the first column of data comprises a subset of values of the first column of data, and the data values of the second column of data comprises a subset of values of the second column of data.

17. The method of claim 15, further comprising:
   dividing the arithmetic expression into a first sub-batch and a second sub-batch, wherein:
      the executing the first set of instructions comprises executing a first set of instructions for the first sub-batch in parallel with executing a first set of instructions for the second sub-batch; and
      the executing the second set of instructions comprises executing a second set of instructions for the first sub-batch in parallel with executing a second set of instructions for the second sub-batch.

18. The method of claim 15, wherein the executing the first set of instructions and executing the second set is performed in a special purpose integrated circuit (IC) that includes one of a field-programmable gate array (FPGA) or an application-specific integrated circuit (ASIC) device.

19. The method of claim 15, wherein the receiving the instructions to evaluate the arithmetic expression comprises receiving the instructions from a host processing device.

20. The method of claim 15, wherein the instructions comprises an instruction to combine a constant value with at least one of a value from the input buffer or a value retrieved from the local buffer.

* * * * *